US011777325B2

(12) United States Patent
Tsubaki et al.

(10) Patent No.: US 11,777,325 B2
(45) Date of Patent: Oct. 3, 2023

(54) IN-VEHICLE SYSTEM AND JUNCTION BOX

(71) Applicant: Yazaki Corporation, Tokyo (JP)

(72) Inventors: Kazuya Tsubaki, Shizouka (JP); Kazuo Sugimura, Shizuoka (JP); Mitsuaki Morimoto, Shizuoka (JP); Eiichiro Oishi, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 17/831,960

(22) Filed: Jun. 3, 2022

(65) Prior Publication Data

US 2022/0416551 A1    Dec. 29, 2022

(30) Foreign Application Priority Data

Jun. 23, 2021    (JP) .................................. 2021-104057

(51) Int. Cl.
*H02J 7/00* (2006.01)
*B60L 3/00* (2019.01)
*B60L 58/10* (2019.01)
*G01R 31/3842* (2019.01)

(52) U.S. Cl.
CPC .......... *H02J 7/0029* (2013.01); *B60L 3/0084* (2013.01); *B60L 58/10* (2019.02); *G01R 31/3842* (2019.01); *H02J 7/007* (2013.01); *H02J 7/0047* (2013.01); *H02J 7/0063* (2013.01); *B60L 2250/10* (2013.01)

(58) Field of Classification Search
None
See application file for complete search history.

(56) References Cited

U.S. PATENT DOCUMENTS

2020/0168960 A1    5/2020  Murase et al.
2020/0369228 A1*  11/2020  Kageyama ............... H02J 9/06
2021/0300480 A1*   9/2021  Kohara ................. B62D 25/20

FOREIGN PATENT DOCUMENTS

JP    2009-126286 A    6/2009
JP    2020-087661 A    6/2020

* cited by examiner

*Primary Examiner* — Jared Fureman
*Assistant Examiner* — Aqeel H Bukhari
(74) *Attorney, Agent, or Firm* — Sughrue Mion, PLLC

(57) ABSTRACT

An in-vehicle system is provided with a front J/B and a first voltage detection unit. The front J/B has a main relay unit, a second voltage detection unit, and a second MCU. Based on detection results detected by the first voltage detection unit and a second voltage detection unit when the main relay unit is subjected to on/off operations, the second MCU monitors whether each of the main relay unit, the first voltage detection unit, and the second voltage detection unit has abnormality or not.

13 Claims, 8 Drawing Sheets

FIG.5

| VERIFICATION ITEM | VERIFICATION CONTENTS | RELAY STATE | | | | | | VOLTAGE SENSOR | | | DETERMINATION CONDITIONS |
|---|---|---|---|---|---|---|---|---|---|---|---|
| | | FRONT J/B | | | | | | FRONT J/B | | BATTERY ECU | |
| | | MAIN RELAY | | CHARGE RELAY | | | | | | | |
| | | POSITIVE ELECTRODE SIDE | NEGATIVE ELECTRODE SIDE | POSITIVE ELECTRODE SIDE | NEGATIVE ELECTRODE SIDE | | | MAIN SIDE | CHARGE SIDE | BATTERY | |
| FRONT J/B MAIN RELAY VERIFICATION 1 | MAIN RELAY POSITIVE-ELECTRODE SIDE SHORT CIRCUIT / MAIN RELAY NEGATIVE-ELECTRODE SIDE SHORT CIRCUIT | OFF | OFF | OFF | OFF | | | ○ | | | FRONT J/B MAIN-SIDE VOLTAGE SENSOR ≠ 0 V |
| FRONT J/B MAIN RELAY VERIFICATION 2 | MAIN RELAY POSITIVE-ELECTRODE SIDE SHORT CIRCUIT | ON | OFF | OFF | OFF | | | ○ | | | FRONT J/B MAIN-SIDE VOLTAGE SENSOR ≠ 0 V |
| FRONT J/B MAIN RELAY VERIFICATION 3 | MAIN RELAY NEGATIVE-ELECTRODE SIDE SHORT CIRCUIT | OFF | ON | OFF | OFF | | | ○ | | | FRONT J/B MAIN-SIDE VOLTAGE SENSOR ≠ 0 V |
| FRONT J/B MAIN RELAY VERIFICATION 4 | MAIN RELAY POSITIVE-ELECTRODE SIDE OPEN / MAIN RELAY NEGATIVE-ELECTRODE SIDE OPEN | ON | ON | OFF | OFF | | | ○ | | ○ | FRONT J/B MAIN-SIDE VOLTAGE SENSOR = BATTERY ECU VOLTAGE SENSOR |
| FRONT J/B CHARGE RELAY VERIFICATION 1 | CHARGE RELAY POSITIVE-ELECTRODE SIDE SHORT CIRCUIT / CHARGE RELAY NEGATIVE-ELECTRODE SIDE SHORT CIRCUIT | OFF | OFF | OFF | OFF | | | | ○ | | FRONT J/B CHARGE-SIDE VOLTAGE SENSOR ≠ 0 V |
| FRONT J/B CHARGE RELAY VERIFICATION 2 | CHARGE RELAY POSITIVE-ELECTRODE SIDE SHORT CIRCUIT | OFF | OFF | ON | OFF | | | | ○ | | FRONT J/B CHARGE-SIDE VOLTAGE SENSOR ≠ 0 V |
| FRONT J/B CHARGE RELAY VERIFICATION 3 | CHARGE RELAY NEGATIVE-ELECTRODE SIDE SHORT CIRCUIT | OFF | OFF | OFF | ON | | | | ○ | | FRONT J/B CHARGE-SIDE VOLTAGE SENSOR ≠ 0 V |
| FRONT J/B CHARGE RELAY VERIFICATION 4 | CHARGE RELAY POSITIVE-ELECTRODE SIDE OPEN / CHARGE RELAY NEGATIVE-ELECTRODE SIDE OPEN | OFF | OFF | ON | ON | | | | ○ | ○ | FRONT J/B CHARGE-SIDE VOLTAGE SENSOR = BATTERY ECU VOLTAGE SENSOR |
| FRONT J/B MAIN-RELAY SIDE VOLTAGE SENSOR VERIFICATION | FRONT J/B MAIN-RELAY SIDE VOLTAGE SENSOR / BATTERY ECU VOLTAGE SENSOR | ON | ON | OFF | OFF | | | ○ | | ○ | FRONT J/B MAIN-SIDE VOLTAGE SENSOR = BATTERY ECU VOLTAGE SENSOR |
| FRONT J/B MAIN-RELAY SIDE VOLTAGE SENSOR VERIFICATION | FRONT J/B MAIN-RELAY SIDE VOLTAGE SENSOR / BATTERY ECU VOLTAGE SENSOR | OFF | OFF | ON | ON | | | | ○ | ○ | FRONT J/B CHARGE-SIDE VOLTAGE SENSOR = BATTERY ECU VOLTAGE SENSOR |
| BATTERY ECU BATTERY VOLTAGE SENSOR VERIFICATION | FRONT J/B MAIN-RELAY SIDE VOLTAGE SENSOR / BATTERY ECU VOLTAGE SENSOR | ON | ON | OFF | OFF | | | ○ | | ○ | FRONT J/B MAIN-SIDE VOLTAGE SENSOR = BATTERY ECU VOLTAGE SENSOR |

FIG. 8

IN-VEHICLE SYSTEM AND JUNCTION BOX

CROSS-REFERENCE TO RELATED APPLICATION(S)

The present application claims priority to and incorporates by reference the entire contents of Japanese Patent Application No. 2021-104057 filed in Japan on Jun. 23, 2021.

BACKGROUND OF THE INVENTION

1. Field of the Invention

The present invention relates to an in-vehicle system and a junction box.

2. Description of the Related Art

Conventionally, for an electric vehicle, there is known a technique in which an assembled battery, which has plural battery blocks connected in series in a battery pack, and a junction box in a voltage-output side of the assembled battery are provided, and electric power is supplied from the battery pack to a motor by an on/off operation of a relay provided in the junction box (for example, Japanese Patent Application Laid-open No. 2020-87661). In this technique, a total voltage value in the battery pack is monitored based on a voltage value detected by a voltage sensor such as a total-voltage monitoring circuit in which a battery electronic control unit (ECU) provided in the battery pack is connected to the assembled battery and the junction box.

However, in above described Japanese Patent Application Laid-open No. 2020-87661, relay abnormalities in the junction box are not monitored. Therefore, in above described Japanese Patent Application Laid-open No. 2020-87661, if at least one of the voltage sensor in the battery pack and the relay in the junction box malfunctions, it has been difficult for the battery ECU to determine which one of the voltage sensor and the relay is malfunctioning.

SUMMARY OF THE INVENTION

Therefore, the present invention has been accomplished in view of the foregoing, and it is an object of the present invention to provide an in-vehicle system and a junction box capable of distinguishing and detecting malfunctions in a voltage sensor and a relay of the junction box.

In order to achieve the above mentioned object, an in-vehicle system according to one aspect of the present invention includes a junction box disposed at least one of front and rear of a battery pack provided in an electric vehicle; and a first voltage detection unit that detects a voltage value of the battery pack, wherein the junction box has a first relay unit that is electrically connected to the battery pack and a drive source, and switches a state of the battery pack and the drive source to a power-distributed state or a shut-off state by an on/off operation, a second voltage detection unit that is electrically connected in parallel with the battery pack, and detects a voltage value of the battery pack, and a controller configured to control the on/off operation of the first relay unit, and the controller monitors whether each of the first relay unit, the first voltage detection unit, and the second voltage detection unit has an abnormality or not based on a detection result detected by each of the first voltage detection unit and the second voltage detection unit when the first relay unit carries out the on/off operation.

In order to achieve the above mentioned object, a junction box disposed at least one of front and rear of a battery pack provided in an electric vehicle and having a first voltage detection unit capable of detecting a voltage value, according to another aspect of the present invention, the junction box includes a first relay unit that is electrically connected to the battery pack and a drive source, and switches a state of the battery pack and the drive source to a power-distributed state or a shut-off state by an on/off operation; a second voltage detection unit that is electrically connected in parallel with the battery pack, and detects a voltage value of the battery pack; and a controller configured to control the on/off operation of the first relay unit, wherein the controller monitors whether each of the first relay unit, the first voltage detection unit, and the second voltage detection unit has an abnormality or not based on a detection result detected by each of the first voltage detection unit and the second voltage detection unit when the first relay unit carries out the on/off operation.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 5 is a diagram illustrating an example of contents of a malfunction determination process executed by a second MCU according to the first embodiment;

FIG. 8 is a diagram illustrating an example of contents of a malfunction determination process executed by the in-vehicle system according to the second embodiment.

DETAILED DESCRIPTION OF THE PREFERRED EMBODIMENTS

Modes (embodiments) for carrying out the present invention will be described in detail with reference to drawings. The present invention is not limited by the contents described in the following embodiments. Also, constituent elements described hereinafter include those that can be easily conceived of by those skilled in the art and practically the same things. Furthermore, configurations described hereinafter can be appropriately combined. Also, the configurations can be subjected to various omittance, replacement, or changes within the range not departing from the gist of the present invention.

First Embodiment

Configuration of Vehicle

Figure 1:
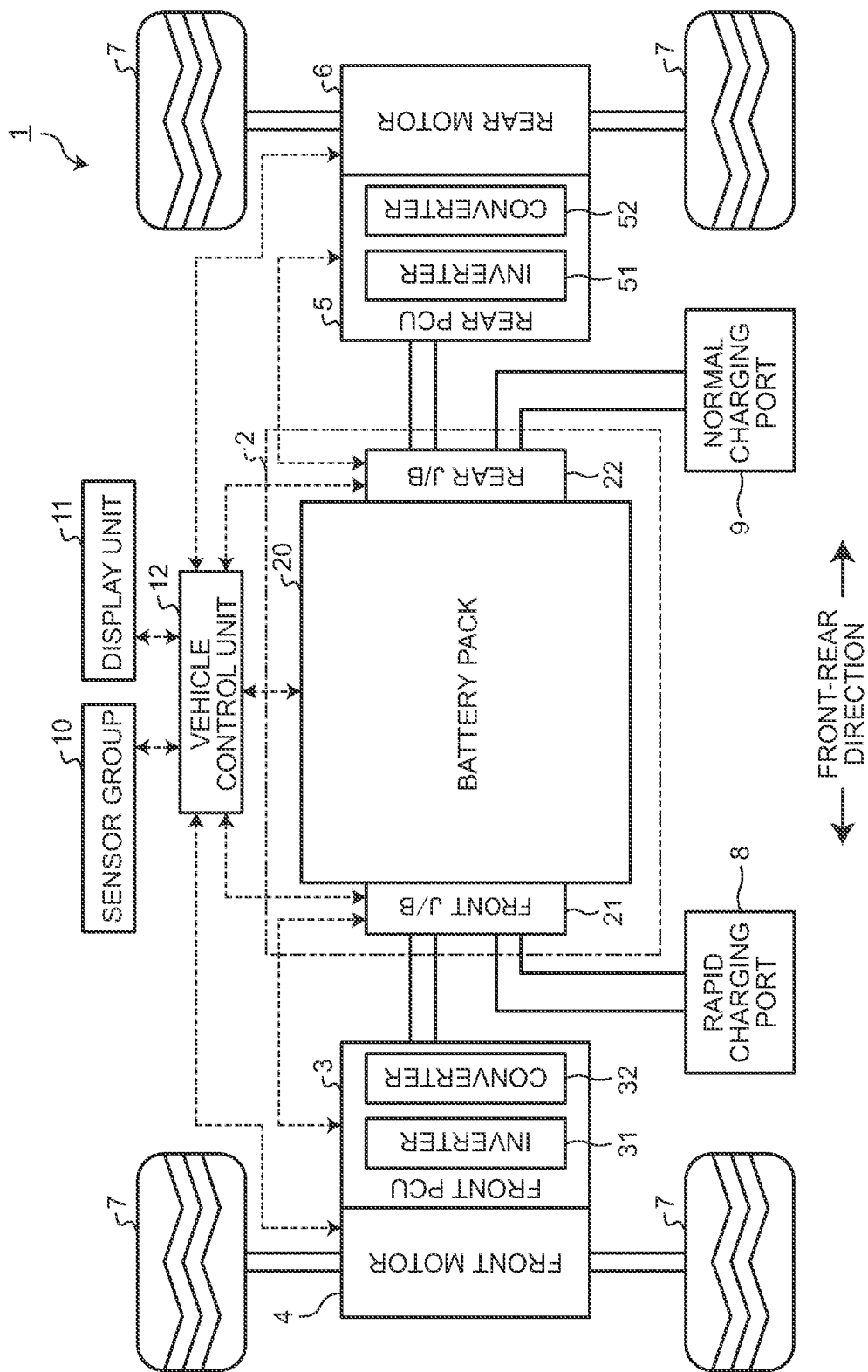
FIG. 1 is a diagram briefly illustrating a configuration of a vehicle on which an in-vehicle system according to a first embodiment is mounted.

With reference to drawings, an in-vehicle system according to a first embodiment will be described. FIG. 1 is a diagram briefly illustrating a configuration of a vehicle on which the in-vehicle system according to the first embodiment is mounted.

A vehicle 1 illustrated in FIG. 1 is provided with an in-vehicle system 2, a front power control unit 3 (hereinafter, simply described as "front PCU 3 (Power Control Unit)" provided in a front side of the vehicle 1, a front motor 4 provided in the front side of the vehicle 1, a rear power control unit 5 (hereinafter, simply described as "rear PCU 5 (Power Control Unit)") provided in a rear side of the vehicle 1, a rear motor 6 provided in the rear side of the vehicle 1, drive wheels 7, a rapid charging port 8, a normal charging port 9, a sensor group 10, a display unit 11, and a vehicle control unit 12.

The in-vehicle system 2 is mounted on the vehicle 1 as a power source of the vehicle 1 and supplies electric power to drive sources such as the front motor 4 and the rear motor 6. The in-vehicle system 2 is mounted on an electric vehicle such as an electric vehicle (EV), a hybrid electric vehicle (HEV), or a plug-in hybrid electric vehicle (PHEV). The in-vehicle system 2 is charged with electric power supplied from an external charger through the rapid charging port 8 or the normal charging port 9 described later and supplies the charged electric power to a load part. The in-vehicle system 2 is charged with electric power supplied from, for example, a rapid charger or a normal charger serving as the external charger and supplies this charged electric power to the front motor 4 and the rear motor 6 serving as drive sources. Herein, the normal charger has, for example, an output voltage value of about 200 V. The rapid charger has a higher output voltage value than that of the normal charger and has, for example, an output voltage value of about 400 V. The normal charger or the rapid charger is installed at a charging station or the like of the vehicle 1 and supplies electric power to the in-vehicle system 2 when the charger is attached to the later-described rapid charging port 8 or the normal charging port 9 of the vehicle 1.

The in-vehicle system 2 is provided with a battery pack 20, a front junction box 21 (hereinafter, simply described as "front J/B 21"), and a rear junction box 22 (hereinafter, simply described as "rear J/B 22").

The battery pack 20 is mounted on the vehicle 1 as a power source of the vehicle 1. The battery pack 20 includes an assembled battery composed by using many cells (secondary batteries). Specifically, in the battery pack 20, each battery block (sometimes referred to as a battery stack) is composed by plural cells electrically connected at least in series or in parallel, and plural battery blocks are electrically connected in series or in parallel to compose the assembled battery. Each cell is composed by using, for example, a lithium-ion secondary battery or a nickel-hydrogen secondary battery. The battery pack 20 stores the electric power for driving the front motor 4 and the rear motor 6, supplies the electric power to the front motor 4 through the front PCU 3, and supplies the electric power to the rear motor 6 through the rear PCU 5. The battery pack 20 is charged by receiving the generated electric power of the front motor 4 and the rear motor 6 through the front PCU 3 and the rear PCU 5 upon regenerative power generation of the front motor 4 and the rear motor 6 such as braking of the vehicle 1. Note that a detailed configuration of the battery pack 20 will be described later.

The front J/B 21 is provided in a front part side in a front-rear direction of the vehicle 1 and electrically connects the battery pack 20, the front PCU 3, and the rapid charging port 8. The front J/B 21 carries out an on/off (ON/OFF) operation in accordance with a control signal from the vehicle control unit 12, thereby causing an electrical connection state between the battery pack 20 and the front PCU 3 to be a power-distributed state or a shut-off state. Also, the front J/B 21 carries out an on/off operation in accordance with a control signal from the vehicle control unit 12, thereby causing an electrical connection state between the battery pack 20 and the rapid charging port 8 to be a power-distributed state or a shut-off state. Note that a detailed configuration of the front J/B 21 will be described later.

The rear J/B 22 is provided in a rear part side in the rear of the front/rear of the vehicle 1 and electrically connects the battery pack 20, the rear PCU 5, and the normal charging port 9. The rear J/B 22 carries out an on/off operation in accordance with a control signal from the vehicle control unit 12, thereby causing an electrical connection state between the battery pack 20 and the rear PCU 5 to be a power-distributed state or a shut-off state. Also, the rear J/B 22 carries out an on/off operation in accordance with a control signal from the vehicle control unit 12, thereby causing an electrical connection state between the battery pack 20 and the normal charging port 9 to be a power-distributed state or a shut-off state. The rear J/B 22 is composed by using, for example, a contact relay (mechanical relay) or a non-contact relay (semiconductor relay).

The front PCU 3 executes bidirectional electric power conversion between the battery pack 20 and the front motor 4 in accordance with a control signal from the vehicle control unit 12. The front PCU 3 includes an inverter 31 for driving the front motor 4 and a converter 32 which raises a direct-current voltage, which is supplied to the inverter 31, to a voltage equal to or higher than an output voltage of the battery pack 20.

The front motor 4 is composed by using an alternate-current rotating electrical machine, is, for example, a three-phase alternate-current synchronous motor in which permanent magnets are buried in a rotor, and functions as a drive source of the vehicle 1. The front motor 4 is driven by the front PCU 3 and generates rotary drive force. The drive force generated by the front motor 4 is transmitted to the drive wheels 7 through power transmitting gears (not illustrated). On the other hand, upon braking of the vehicle 1, the front motor 4 works as an electric power generator and carries out regenerative power generation. The electric power generated by the front motor 4 is supplied to the battery pack 20 through the front PCU 3 and the front J/B 21 and is stored in the battery pack 20.

The rear PCU 5 executes bidirectional electric power conversion between the battery pack 20 and the rear motor 6 in accordance with a control signal from the vehicle control unit 12. The rear PCU 5 includes an inverter 51 for driving the rear motor 6 and a converter 52 which raises a direct-current voltage, which is supplied to the inverter 51, to a voltage equal to or higher than an output voltage of the battery pack 20.

The rear motor 6 is composed by using an alternate-current rotating electrical machine, is, for example, a three-phase alternate-current synchronous motor in which permanent magnets are buried in a rotor, and functions as a drive source of the vehicle 1. The rear motor 6 is driven by the rear PCU 5 and generates rotary drive force. The drive force generated by the rear motor 6 is transmitted to the drive wheels 7 through power transmitting gears (not illustrated). On the other hand, upon braking of the vehicle 1, the rear motor 6 works as an electric power generator and carries out regenerative power generation. The electric power generated by the rear motor 6 is supplied to the battery pack 20 through the rear PCU 5 and the rear J/B 22 and is stored in the battery pack 20.

The rapid charging port 8 is a so-called DC inlet, and a connector of an external rapid charger or an ultrarapid charger which is not illustrated is electrically connected to the port detachably. The rapid charging port 8 is electrically connected to the front J/B 21. The rapid charging port 8 outputs the electric power, which is supplied from the rapid charger or the ultrarapid charger, to the front J/B 21.

The normal charging port 9 is a so-called AC inlet, and a connector of an unillustrated normal charger, which has a lower charge voltage than a rapid charger, is electrically connected to the port detachably. The normal charging port 9 is electrically connected to the rear J/B 22. The normal charging port 9 outputs the electric power, which is supplied from the normal charger, to the rear J/B 22.

The sensor group 10 is composed by using an acceleration sensor, a gyroscope sensor, a velocity sensor, an ignition sensor, etc. The sensor group 10 detects a state of the vehicle 1 and outputs this detection result to the vehicle control unit 12. Herein, the state of the vehicle 1 is, for example, any of a stopped state, a traveling state, and an idling state of the vehicle 1. For example, when the velocity sensor detects the velocity of the vehicle 1, the sensor group 10 detects the state of the vehicle 1 as traveling information and outputs this detection result to the vehicle control unit 12.

Meanwhile, when the velocity sensor cannot detect the velocity of the vehicle 1, the sensor group 10 detects the state of the vehicle 1 as a stopped state and outputs this detection result to the vehicle control unit 12.

The display unit 11 is composed by using a display monitor of a liquid crystal or organic EL display (Organic Electroluminescent Display). The display unit 11 displays various information about the vehicle 1 in accordance with control signals from the vehicle control unit 12.

The vehicle control unit 12 includes a memory, a central processing unit (CPU), a processor having hardware, a signal input part, etc. The vehicle control unit 12 controls the units constituting the vehicle 1.

Detailed Configurations of Battery Pack and Front J/B

Figure 2:
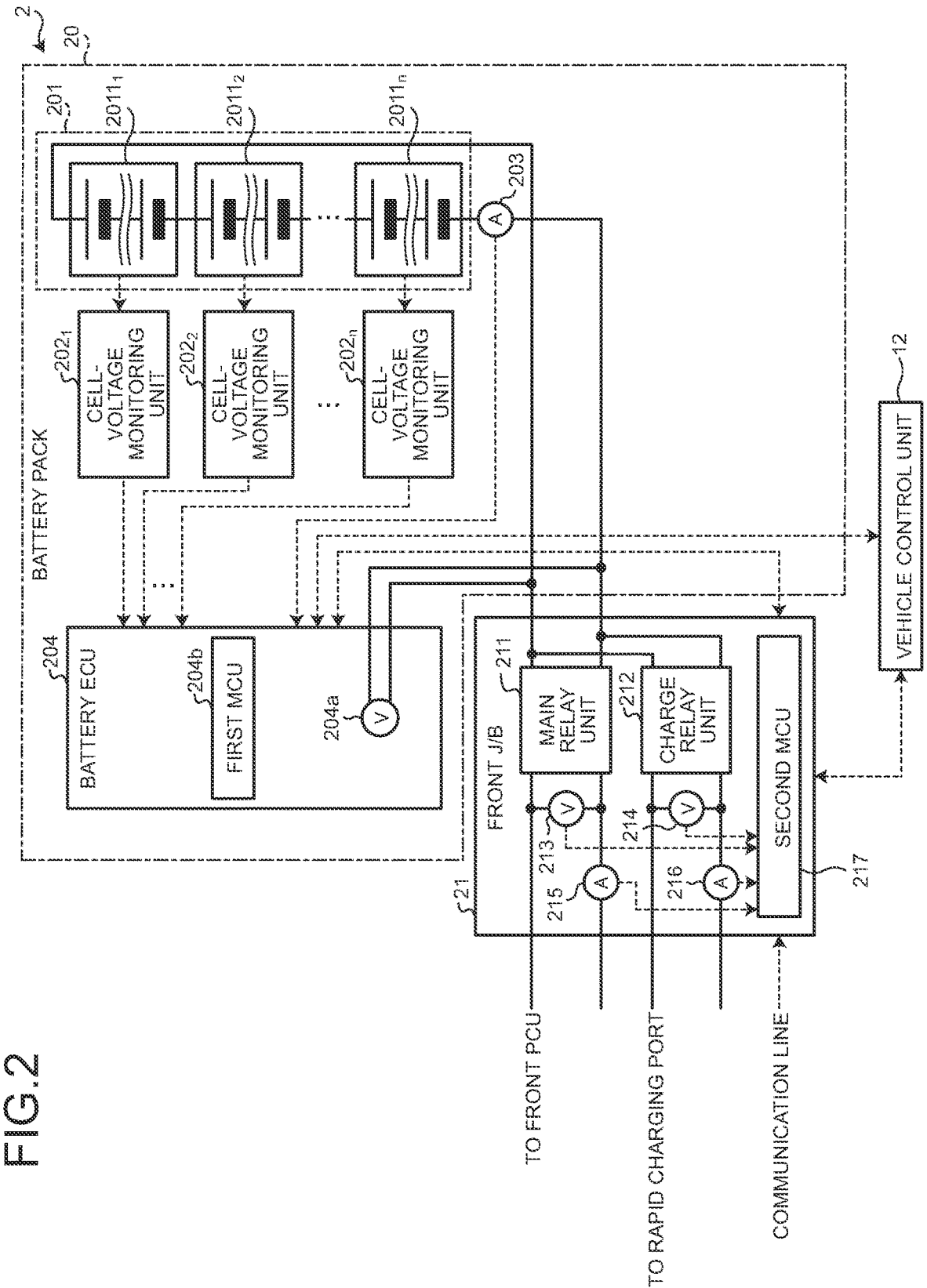
FIG. 2 is a diagram schematically illustrating a detailed configuration example of a battery pack and a front junction box in the in-vehicle system according to the first embodiment.
Figure 3:
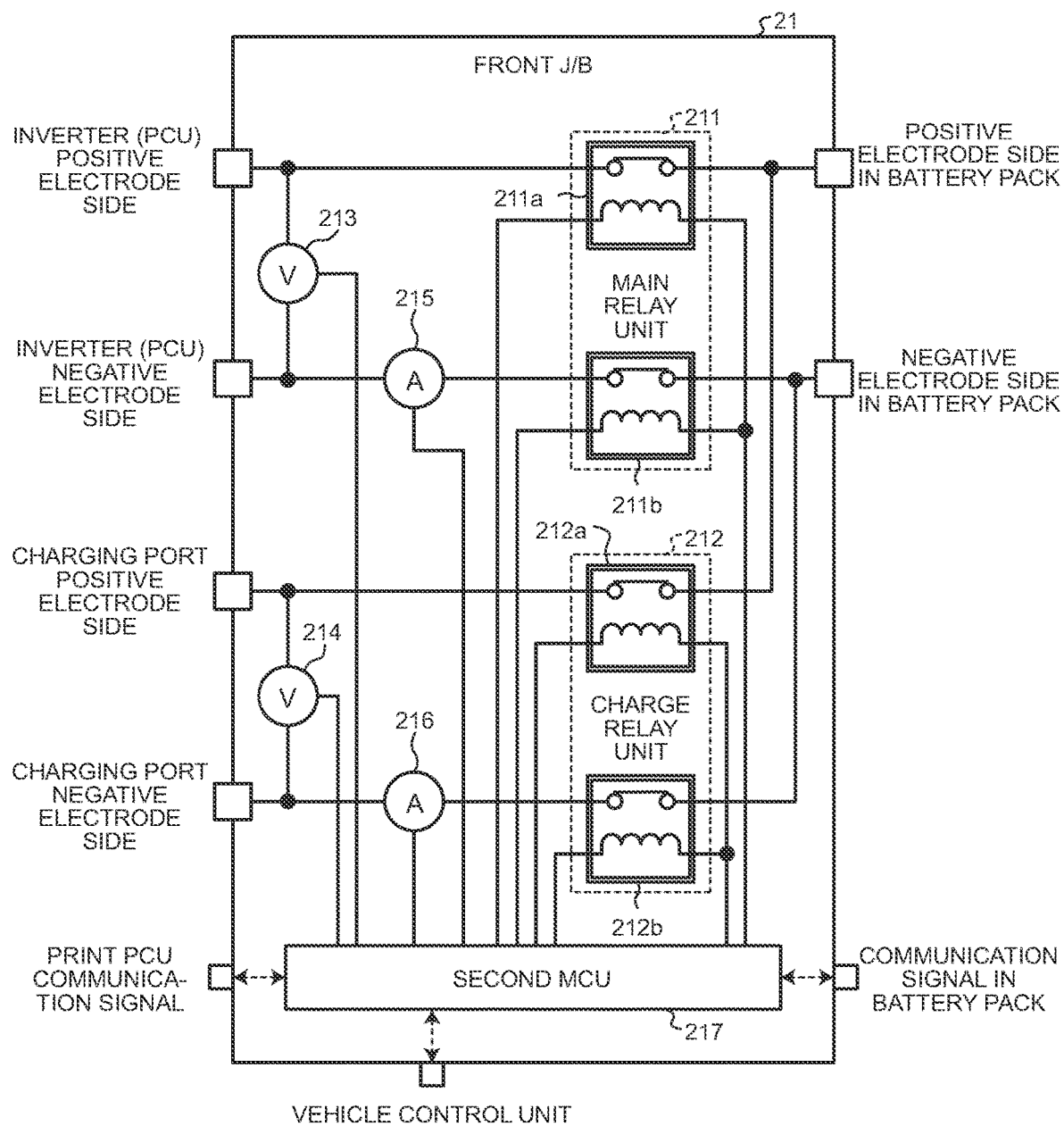
FIG. 3 is a diagram schematically illustrating a detailed configuration example of the front junction box according to the first embodiment.

Next, detailed configurations of the battery pack 20 and the front J/B 21 in the in-vehicle system 2 will be described. FIG. 2 is a diagram schematically illustrating a detailed configuration example of the battery pack 20 and the front J/B 21 in the in-vehicle system 2. FIG. 3 is a diagram schematically illustrating a detailed configuration example of the front J/B 21.

Detailed Configuration of Battery Pack

First, a detailed configuration of the battery pack 20 will be described. As illustrated in FIG. 2, the battery pack 20 has an assembled battery 201, plural cell-voltage monitoring units $202_1$ to $202_n$ (n=an integer of 3 or higher) (hereinafter, when any of the plural cell-voltage monitoring units $202_1$ to $202_n$ is mentioned, it will be simply described as "cell-voltage monitoring unit 202"), a first current detection unit 203, and a battery ECU 204.

The assembled battery 201 is mounted on the vehicle 1 and stores electric power. The assembled battery 201 has plural battery modules $2011_1$ to $2011_n$ (n=an integer of 3 or higher) (hereinafter, when any of the plural battery modules $2011_1$ to $2011_n$ is mentioned, it will be simply described as "battery module 2011"). The battery module 2011 has plural battery cells. Each battery cell is composed by using a secondary battery which can be charged/discharged. Each battery cell is composed by using, for example, a lithium-ion battery or the like. The battery cells are juxtaposed and are electrically connected in series mutually with the battery cells positioned next thereto.

The cell-voltage monitoring unit 202 detects a voltage value of the battery module 2011 and is composed by using a voltage meter or the like. The cell-voltage monitoring units 202 are provided to correspond to the battery modules 2011. The cell-voltage monitoring units 202 are electrically connected in parallel with the battery module 2011 and are electrically connected to the battery ECU 204. The cell-voltage monitoring unit 202 detects the voltage value between a positive electrode and a negative electrode of the battery module 2011 and outputs this detection result to the battery ECU 204.

The first current detection unit 203 detects the current value in the assembled battery 201 and is composed by using a current meter or the like. The first current detection unit 203 is electrically connected in series with the assembled battery 201 and is electrically connected to the battery ECU 204. The first current detection unit 203 detects the current value between a positive electrode (plus side) and a negative electrode (minus side) of the assembled battery 201 and outputs this detection result to the battery ECU 204.

The battery ECU 204 monitors the voltage value and the current value of the assembled battery 201. The battery ECU 204 and the cell-voltage monitoring units 202 are referred to as, for example, cell voltage sensors (CVS; Cell Voltage Sensors) or a battery management system (BMS; Battery Management System). The battery ECU 204 has a first voltage detection unit 204a and a first microcontroller unit (MCU) 204b.

The first voltage detection unit 204a detects the total voltage value of the assembled battery 201 and is composed by using a voltage meter or the like. The first voltage detection unit 204a is electrically connected to a pair of electric power lines connected to the positive electrode and the negative electrode of the assembled battery 201 and is electrically connected in parallel with the assembled battery 201. The first voltage detection unit 204a detects the voltage value between the positive electrode and the negative electrode of the assembled battery 201 and outputs this detection result to the first MCU 204b. The first voltage detection unit 204a is composed by using, for example, an A/D converter (not illustrated). Specifically, the first voltage detection unit 204a converts the input voltage value to a digital signal by an A/D converter and outputs the signal to the first MCU 204b. Note that the place in which the first voltage detection unit 204a is electrically connected may be appropriately changed. For example, the first voltage detection unit 204a may be electrically connected to a pair of electric power lines branched in the front J/B 21.

The first MCU 204b includes, for example, a memory, a processor having hardware of a CPU, and a signal input part. The first MCU 204b receives the signals of the detection results detected by the cell-voltage monitoring units 202 and the first current detection unit 203. Specifically, the first MCU 204b receives the voltage values of the battery modules 2011 detected by the cell-voltage monitoring units 202. Furthermore, the first MCU 204b receives the current value between the positive electrode and the negative electrode of the assembled battery 201 detected by the first current detection unit 203. Furthermore, the first MCU 204b is electrically connected to the first voltage detection unit 204a and receives the voltage value of the assembled battery 201 detected by the first voltage detection unit 204a.

Also, the first MCU 204b periodically executes self-diagnosis of the cell-voltage monitoring units 202, the first voltage detection unit 204a, and the battery ECU 204 in accordance with control signals from the vehicle control unit 12. Herein, in the self-diagnosis, for example, operation of each of the cell-voltage monitoring units 202 and the first voltage detection unit 204a is checked.

Detailed Configuration of Front J/B

Next, a detailed configuration of the front J/B 21 will be described. As illustrated in FIG. 2 and FIG. 3, the front J/B 21 is provided on the electric power lines electrically connected to the positive electrode and the negative electrode of the assembled battery 201. The front J/B 21 is provided with a main relay unit 211, a charge relay unit 212, a second voltage detection unit 213, a third voltage detection unit 214, a second current detection unit 215, a third current detection unit 216, and a second MCU 217.

The main relay unit 211 switches the connection state between the assembled battery 201 and the front PCU 3 to a power-distributed state or a shut-off state in accordance with a control signal from the second MCU 217. The main relay unit 211 has a first main relay 211a and a second main relay 211b. Note that, in the first embodiment, the main relay unit 211 functions as a first relay unit.

The first main relay 211a has a first end electrically connected to the positive electrode (plus side) of the battery pack 20 and has a second end electrically connected to the positive electrode side (positive electrode side of the inverter) of the front PCU 3. The first main relay 211a is composed by using a contact relay or the like. The first main relay 211a allows or shuts off distribution of the current from the battery pack 20 in accordance with a control signal from the second MCU 217.

The second main relay 211b has a first end electrically connected to the negative electrode (minus side) of the battery pack 20 and has a second end electrically connected to the negative electrode side (negative electrode side of the inverter 31) of the front PCU 3. The second main relay 211b is composed by using a contact relay or the like. The second main relay 211b allows or shuts off distribution of the current from the battery pack 20 in accordance with a control signal from the second MCU 217.

The charge relay unit 212 switches the connection state between the assembled battery 201 and the rapid charging port 8 to a power-distributed state or a shut-off state in accordance with a control signal from the second MCU 217. The charge relay unit 212 has a first charge relay 212a and a second charge relay 212b. Note that, in the first embodiment, the charge relay unit 212 functions as a second relay unit.

The first charge relay 212a has a first end electrically connected to the positive electrode (plus side) of the battery pack 20 and has a second end electrically connected to the positive electrode side (plus side) of a charger (for example, the rapid charging port 8). The first charge relay 212a is composed by using a contact relay or the like. The first charge relay 212a allows or shuts off distribution of the current from the battery pack 20 in accordance with the control signal from the second MCU 217.

The second charge relay 212b has a first end electrically connected to the negative electrode (minus side) of the battery pack 20 and has a second end electrically connected to the negative electrode side (minus side) of the charger (for example, the rapid charging port 8). The second charge relay 212b is composed by using a contact relay or the like. The second charge relay 212b allows or shuts off distribution of the current from the battery pack 20 in accordance with the control signal from the second MCU 217.

The second voltage detection unit 213 detects the voltage value of the battery pack 20 and is composed by using a voltage meter or the like. The second voltage detection unit 213 is electrically connected between the pair of electric power lines connecting the battery pack 20 and the front PCU 3 and is electrically connected in parallel with the assembled battery 201. Furthermore, the second voltage detection unit 213 is electrically connected to the second MCU 217. The second voltage detection unit 213 detects the voltage value between the positive electrode and the negative electrode of the battery pack 20 and outputs this detection result to the second MCU 217. The second voltage detection unit 213 is composed by using, for example, an A/D converter (not illustrated). Specifically, the second voltage detection unit 213 converts the input voltage value to a digital signal by an A/D converter and outputs the signal to the second MCU 217.

The third voltage detection unit 214 detects the voltage value of the battery pack 20 and is composed by using a voltage meter or the like. The third voltage detection unit 214 is electrically connected between the pair of electric power lines electrically connecting the battery pack 20 and the charger and is electrically connected in parallel with respect to the assembled battery 201. Furthermore, the third voltage detection unit 214 is electrically connected to the second MCU 217. The third voltage detection unit 214 detects the voltage value between the positive electrode and the negative electrode of the battery pack 20 and outputs this detection result to the second MCU 217. The third voltage detection unit 214 is composed by using, for example, an A/D converter (not illustrated). Specifically, the third voltage detection unit 214 converts the input voltage value to a digital signal by an A/D converter and outputs the signal to the second MCU 217.

The second current detection unit 215 detects the current value in the battery pack 20 and is composed by using a current meter or the like. The second current detection unit 215 is electrically connected in series with the assembled battery 201 and is electrically connected to the second MCU 217. Specifically, the second current detection unit 215 is provided between the electric power lines of the second main relay 211b and the front PCU 3 (negative electrode side of the inverter 31). The second current detection unit 215 detects the current value between the positive electrode and the negative electrode of the assembled battery 201 and outputs this detection result to the second MCU 217.

The third current detection unit 216 detects the current value in the battery pack 20 and is composed by using a current meter or the like. The third current detection unit 216 is electrically connected in series with the assembled battery 201 and is electrically connected to the second MCU 217. Specifically, the third current detection unit 216 is provided between the electric power lines of the second charge relay 212b and the charger (negative electrode side). The third current detection unit 216 detects the current value between the positive electrode and the negative electrode of the assembled battery 201 and outputs this detection result to the second MCU 217.

The second MCU 217 includes, for example, a memory, a processor having hardware of a CPU, and a signal input part. The second MCU 217 controls on/off operations of the main relay unit 211 and the charge relay unit 212 in accordance with control signals from an in-vehicle outlet 112. Also, the second MCU 217 receives the signals of the detection results detected by each of the second voltage detection unit 213, the third voltage detection unit 214, the second current detection unit 215, and the third current detection unit 216 in the on/off operations of the main relay unit 211 and the charge relay unit 212. Furthermore, the second MCU 217 monitors malfunctions of each of the main relay unit 211, the charge relay unit 212, the second voltage detection unit 213, the third voltage detection unit 214, and the first voltage detection unit 204a in accordance with the control signals from the vehicle control unit 12. Specifically, when the main relay unit 211 and the charge relay unit 212 are subjected to on/off operations, the second MCU 217 monitors malfunctioning of each of the units constituting the in-vehicle system 2 based on the detection results received from the second voltage detection unit 213, the third voltage detection unit 214, the second current detection unit 215, and the third current detection unit 216 and based on the signals from the first MCU 204b. For example, if a stop signal that means the vehicle 1 is stopped is received from the vehicle control unit 12, the second MCU 217 monitors malfunctions of each of the units constituting the in-vehicle system 2, specifically, the main relay unit 211, the second voltage detection unit 213, and the third voltage detection unit 214. Herein, the signals from the first MCU 204b include the voltage value of the assembled battery 201 detected by a first voltage detection unit 214a and the current value of the first current detection unit 203. Note that, in the first embodiment, the second MCU 217 functions as a controller of the in-vehicle system 2.

Operation Example of In-Vehicle System

Figure 4:
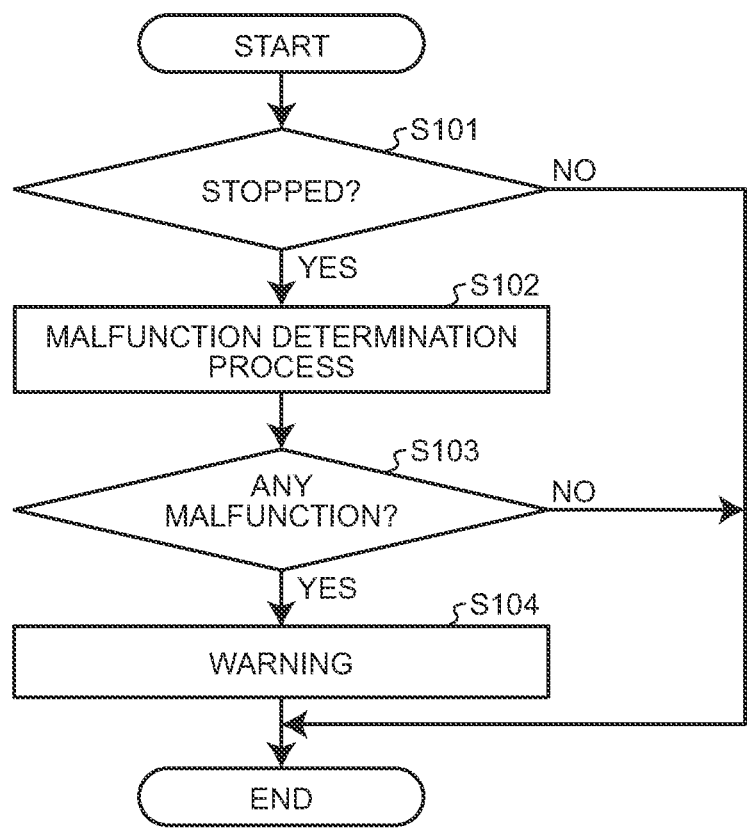
FIG. 4 is a flow chart illustrating an operation example executed by the in-vehicle system according to the first embodiment.

Next, an operation example of the in-vehicle system 2 will be described. FIG. 4 is a flow chart illustrating an operation example executed by the in-vehicle system 2.

As illustrated in FIG. 4, first, the second MCU 217 determines whether the vehicle 1 is stopped or not based on the signal input from the vehicle control unit 12 (step S101). Specifically, the second MCU 217 determines whether the stop signal, which means the vehicle 1 is stopped, has been received from the vehicle control unit 12 or not. If the stop signal has been received, the second MCU 217 determines that the vehicle 1 is stopped. If the stop signal has not been received, the second MCU 217 determines that the vehicle 1 is not stopped. Herein, "stopped" means any of: a state in which a power source of the vehicle 1 is activated (a state in which activation of the vehicle 1 has been detected by an ignition sensor), a state in which a door(s) of the vehicle 1 is unlocked, and a state in which the main relay unit 211 is subjected to an on operation to charge a low-voltage battery with the battery pack 20 when the capacity of the unillustrated low-voltage battery is lowered in a state in which the vehicle 1 is stopped. If the second MCU 217 determines that the vehicle 1 is stopped (step S101: Yes), the process makes a transition to later-described step S102. On the other hand, if the second MCU 217 determines that the vehicle 1 is not stopped (step S101: No), the present process is terminated.

In step S102, the second MCU 217 executes a malfunction determination process of each of the units constituting the in-vehicle system 2. After step S102, the second MCU 217 makes a transition to later-described step S103.

Herein, details of the malfunction determination process will be described. FIG. 5 is a diagram illustrating an example of contents of the malfunction determination process executed by the second MCU 217.

First, in Table T1 illustrated in FIG. 5, a case in which the second MCU 217 carries out a verification item "front J/B 21, main relay verification 1" while the vehicle 1 is stopped will be described.

First, the second MCU 217 shuts off the power-distributed state between the assembled battery 201 and the front J/B 21 by turning off the first main relay 211a and the second main relay 211b. Furthermore, the second MCU 217 shuts off the power-distributed state between the assembled battery 201 and the rapid charging port 8 by turning off the first charge relay 212a and the second charge relay 212b. In this case, the second MCU 217 acquires the voltage value detected by the second voltage detection unit 213 (main-side voltage sensor) and determines whether the acquired voltage value is not 0 (front J/B 21 main-side voltage sensor≠0). Specifically, the second MCU 217 determines whether the voltage of the assembled battery 201 is not applied to the front J/B 21. If the voltage value acquired from the second voltage detection unit 213 (main-side voltage sensor) is 0, the second MCU 217 determines that each of the first main relay 211a and the second main relay 211b is not short-circuited. In other words, the second MCU 217 determines that each of the first main relay 211a and the second main relay 211b is normal. On the other hand, if the voltage value acquired from the second voltage detection unit 213 (main-side voltage sensor) is not 0, the second MCU 217 determines that each of the first main relay 211a and the second main relay 211b is short-circuited. In other words, the second MCU 217 determines that each of the first main relay 211a and the second main relay 211b is malfunctioning.

Also, as illustrated in Table T1 illustrated in FIG. 5, while the vehicle 1 is stopped, the second MCU 217 carries out a verification item "front J/B 21 main relay verification 2, 3" by a method similar to that of above described "front J/B 21, main relay verification 1".

Next, in Table T1 illustrated in FIG. 5, a case in which the second MCU 217 carries out a verification item "front J/B 21, main relay verification 4" while the vehicle 1 is stopped will be described.

First, the second MCU 217 causes the state of the assembled battery 201 and the front J/B 21 to be a power-distributed state by turning on the first main relay 211a and the second main relay 211b. In this case, the second MCU 217 acquires the voltage value detected by the second voltage detection unit 213 (main-side voltage sensor) and the voltage value detected by the first voltage detection unit 204a through the first MCU 204b. Subsequently, the second MCU 217 determines whether the voltage value detected by the second voltage detection unit 213 (main-side voltage sensor) and the voltage value detected by the first voltage detection unit 204a are the same or not (J/B main-side voltage sensor=battery ECU voltage sensor). If the voltage value detected by the second voltage detection unit 213 (main-side voltage sensor) and the voltage value detected by the first voltage detection unit 204a are the same, the second MCU 217 determines that the main relay unit 211 is normal. In other words, the second MCU 217 can determine that the main relay unit 211 is to be subjected to an on operation. On the other hand, if the voltage value detected by the second voltage detection unit 213 (main-side voltage sensor) and the voltage value detected by the first voltage detection unit 204a are not the same, the second MCU 217 determines that the main relay unit 211 is malfunctioning. In other words, the second MCU 217 determines that the main relay unit 211 cannot be subjected to an on operation.

Also, as illustrated in Table T1 illustrated in FIG. 5, also in the charge relay unit 212, the second MCU 217 carries out test items "charge relay verification 1 to 4" by a method similar to that of the above described main relay unit 211. Specifically, the second MCU 217 subjects each of the first charge relay 212a and the second charge relay 212b to on/off operations. In this case, the second MCU 217 acquires the voltage value detected by the third voltage detection unit 214 (J/B charge-side voltage sensor) and the voltage value detected by the first voltage detection unit 204a through the first MCU 204b. Subsequently, the second MCU 217 monitors malfunctioning of each unit of the charge relay unit 212 based on the voltage value acquired from the third voltage detection unit 214 (J/B charge-side voltage sensor) and the voltage value acquired from the first voltage detection unit 204a.

Furthermore, as illustrated in Table T1 illustrated in FIG. 5, the second MCU 217 carries out test items "front J/B 21 main-relay side voltage sensor verification" and "front J/B 21 charge-relay side voltage sensor verification" by a method similar to the above described main relay unit 211. Specifically, the second MCU 217 acquires a voltage value from each of the second voltage detection unit 213, the third voltage detection unit 214, and the first voltage detection unit 204a when the main relay unit 211 and the charge relay unit 212 are subjected to on/off operations. Subsequently, the second MCU 217 monitors malfunctioning of each of the second voltage detection unit 213 and the third voltage detection unit 214 based on the voltage value acquired from each of the second voltage detection unit 213, the third voltage detection unit 214, and the first voltage detection unit 204a.

Also, as illustrated in Table T1 illustrated in FIG. 5, the second MCU 217 carries out a test item "battery ECU battery voltage sensor verification" by a method similar to that of the above described main relay unit 211. Specifically, the second MCU 217 acquires a voltage value from each of the second voltage detection unit 213, the third voltage detection unit 214, and the first voltage detection unit 204a when the main relay unit 211 and the charge relay unit 212 are subjected to on/off operations. Subsequently, the second MCU 217 monitors malfunctioning of the first voltage detection unit 204a based on battery values acquired from the second voltage detection unit 213, the third voltage detection unit 214, and the first voltage detection unit 204a.

In this manner, the second MCU 217 monitors malfunctioning of each of the units of the in-vehicle system 2 based on the voltage values from the second voltage detection unit 213, the third voltage detection unit 214, and the first voltage detection unit 204a when the main relay unit 211 and the charge relay unit 212 are subjected to on/off operations.

Returning to FIG. 4, descriptions of step S103 and thereafter will be continued.

In step S103, if any of the units constituting the in-vehicle system 2 is malfunctioning (step S103: Yes), the second MCU 217 outputs a warning, which indicates that any of the units constituting the in-vehicle system 2 is malfunctioning, by the display unit 11 through the vehicle control unit 12 (step S104). In this case, other than the output to the display unit 11, the second MCU 217 may cause, through the vehicle control unit 12, an unillustrated speaker or the like to output a warning indicating that any of the units constituting the in-vehicle system 2 is malfunctioning. By virtue of this, a user of the vehicle 1 can intuitively understand occurrence of the malfunction in the in-vehicle system 2 mounted in the vehicle 1. After step S104, the second MCU 217 terminates the present process. On the other hand, if all of the units constituting the in-vehicle system 2 is not malfunctioning (step S103: No), the second MCU 217 terminates the present process.

By virtue of this configuration describe above, in the in-vehicle system 2, based on the detection results detected by the first voltage detection unit 204a and the second voltage detection unit 213 when the main relay unit 211 is subjected to on/off operations, the second MCU 217 monitors whether each of the main relay unit 211, the first voltage detection unit 204a, and the second voltage detection unit 213 has abnormality or not. As a result, malfunctioning in the first voltage detection unit 204a (voltage sensor) of the battery ECU 204 and the main relay unit 211 in the front J/B 21 can be distinguished and detected. As a result, malfunctioning of a relay of, for example, a mechanical type or a semiconductor type can be detected.

Based on the detection results detected by the first voltage detection unit 204a and the third voltage detection unit 214 when the charge relay unit 212 is subjected to on/off operations, in the above described in-vehicle system 2, the second MCU 217 monitors whether each of the charge relay unit 212, the first voltage detection unit 204a, and the third voltage detection unit 214 is malfunctioning or not. As a result, malfunctioning in the first voltage detection unit 204a (voltage sensor) of the battery ECU 204 and the charge relay unit 212 in the front J/B 21 can be distinguished and detected.

In the above described in-vehicle system 2, based on the detection results detected by the first voltage detection unit 204a and the second voltage detection unit 213 when the main relay unit 211 is subjected to on/off operations while the vehicle 1 is stopped, the second MCU 217 monitors whether each of the main relay unit 211, the first voltage detection unit 204a, and the second voltage detection unit 213 has abnormality or not. Furthermore, based on the detection results detected by the first voltage detection unit 204a and the third voltage detection unit 214 when the charge relay unit 212 is subjected to on/off operations, the second MCU 217 monitors whether each of the charge relay unit 212, the first voltage detection unit 204a, and the third voltage detection unit 214 is malfunctioning or not. By virtue of this, malfunctioning of the units constituting the in-vehicle system 2 can be detected before the vehicle 1 starts moving.

In the above described in-vehicle system 2, if at least one of the main relay unit 211, the charge relay unit 212, the first voltage detection unit 204a, the second voltage detection unit 213, and the third voltage detection unit 214 is malfunctioning, the second MCU 217 outputs a warning, which indicates the occurrence of the malfunctioning, to the display unit 11. By virtue of this, a user of the vehicle 1 can intuitively understand occurrence of the malfunction in the in-vehicle system 2 mounted in the vehicle 1.

Note that, in the above described in-vehicle system 2, the second voltage detection unit 213, the third voltage detection unit 214, the second current detection unit 215, and the third current detection unit 216 are provided in the front J/B 21, but are not limited to be provided therein. The second voltage detection unit 213, the third voltage detection unit 214, the second current detection unit 215, and the third current detection unit 216 may be provided in the rear J/B 22. By virtue of this, malfunctioning of the first voltage detection unit 204a (voltage sensor) of the battery ECU 204 and the relay of each of the constituent units in the rear J/B 22 can be distinguished and detected.

Second Embodiment

Next, an in-vehicle system according to a second embodiment will be described. The in-vehicle system according to the second embodiment is further provided with a rear J/B, which can detect voltage values and current values, in a rear side of a battery pack. Moreover, the in-vehicle system according to the second embodiment can detect the current value of the assembled battery even when either one of the current sensor of the front J/B side and the current sensor of the rear J/B side malfunctions. Hereinafter, a vehicle according to the second embodiment will be described. Note that, in the second embodiment, constituent elements equivalent to those of the first embodiment are denoted by the same symbols, and detailed descriptions thereof will be omitted.

Configuration of Vehicle

Figure 6:
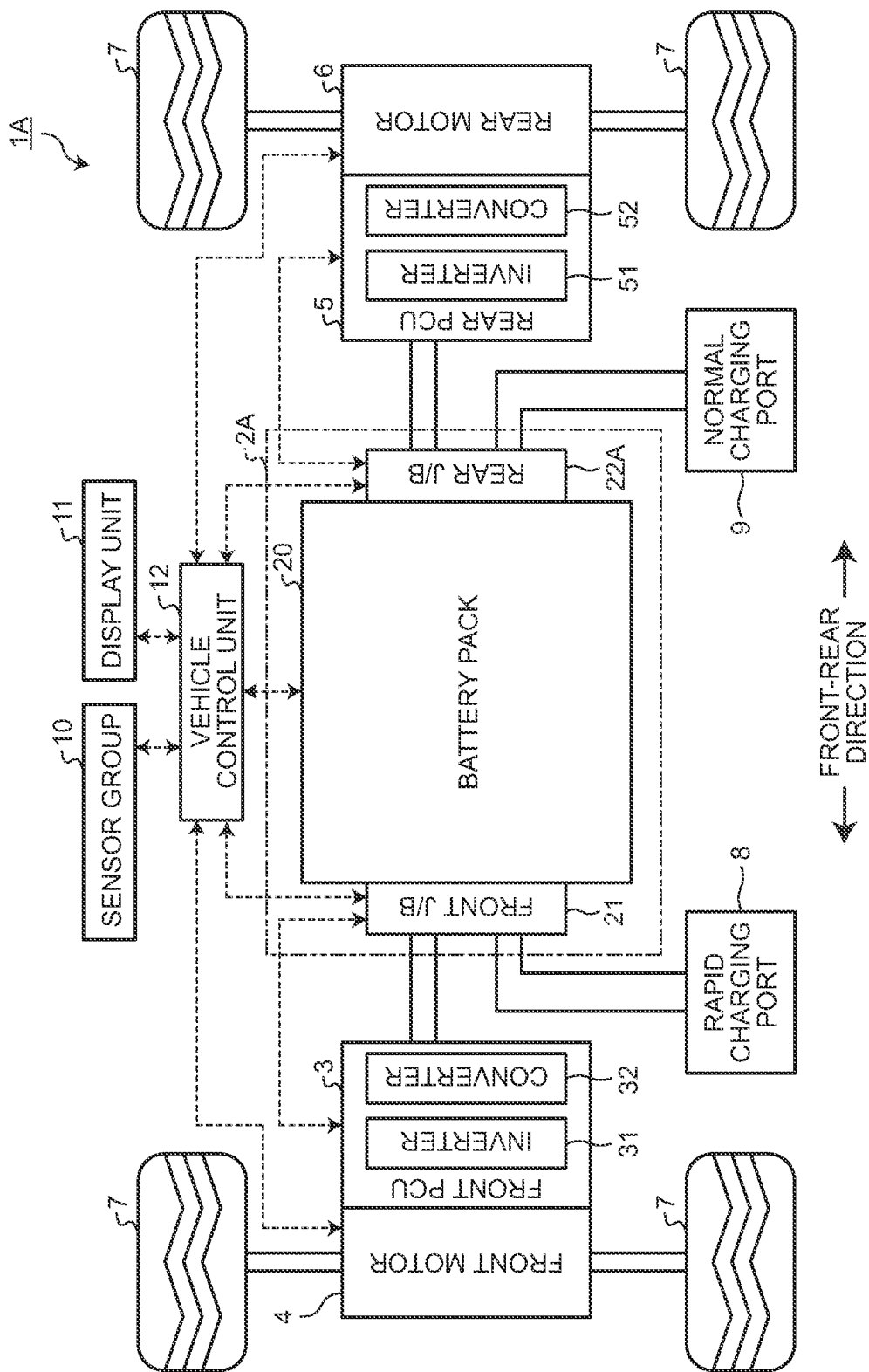
FIG. 6 is a diagram briefly illustrating a configuration of a vehicle on which an in-vehicle system according to a second embodiment is mounted.

FIG. 6 is a diagram briefly illustrating a configuration of a vehicle on which the in-vehicle system according to the second embodiment is mounted.

A vehicle 1A illustrated in FIG. 6 is provided with an in-vehicle system 2A instead of the in-vehicle system 2 of the vehicle 1 according to the first embodiment. The in-vehicle system 2A is mounted on the vehicle 1A as a power source of the vehicle 1A and supplies electric power to load parts such as the front motor 4 and the rear motor 6. The in-vehicle system 2A is provided with a rear J/B 22A instead of the rear J/B 22 of the in-vehicle system 2 according to the first embodiment.

The rear J/B 22A is provided in a rear part side in the rear of the front/rear of the vehicle 1A and electrically connects the battery pack 20, the rear PCU 5, and the normal charging port 9. The rear J/B 22A carries out an on/off operation in accordance with a control signal from the vehicle control unit 12, thereby causing an electrical connection state between the battery pack 20 and the rear PCU 5 to be a power-distributed state or a shut-off state. Also, the rear J/B 22A carries out an on/off operation in accordance with a control signal from the vehicle control unit 12, thereby causing an electrical connection state between the battery pack 20 and the normal charging port 9 to be a power-distributed state or a shut-off state.

Detailed Configurations of Battery Pack, Front J/B, and Rear J/B

Figure 7:
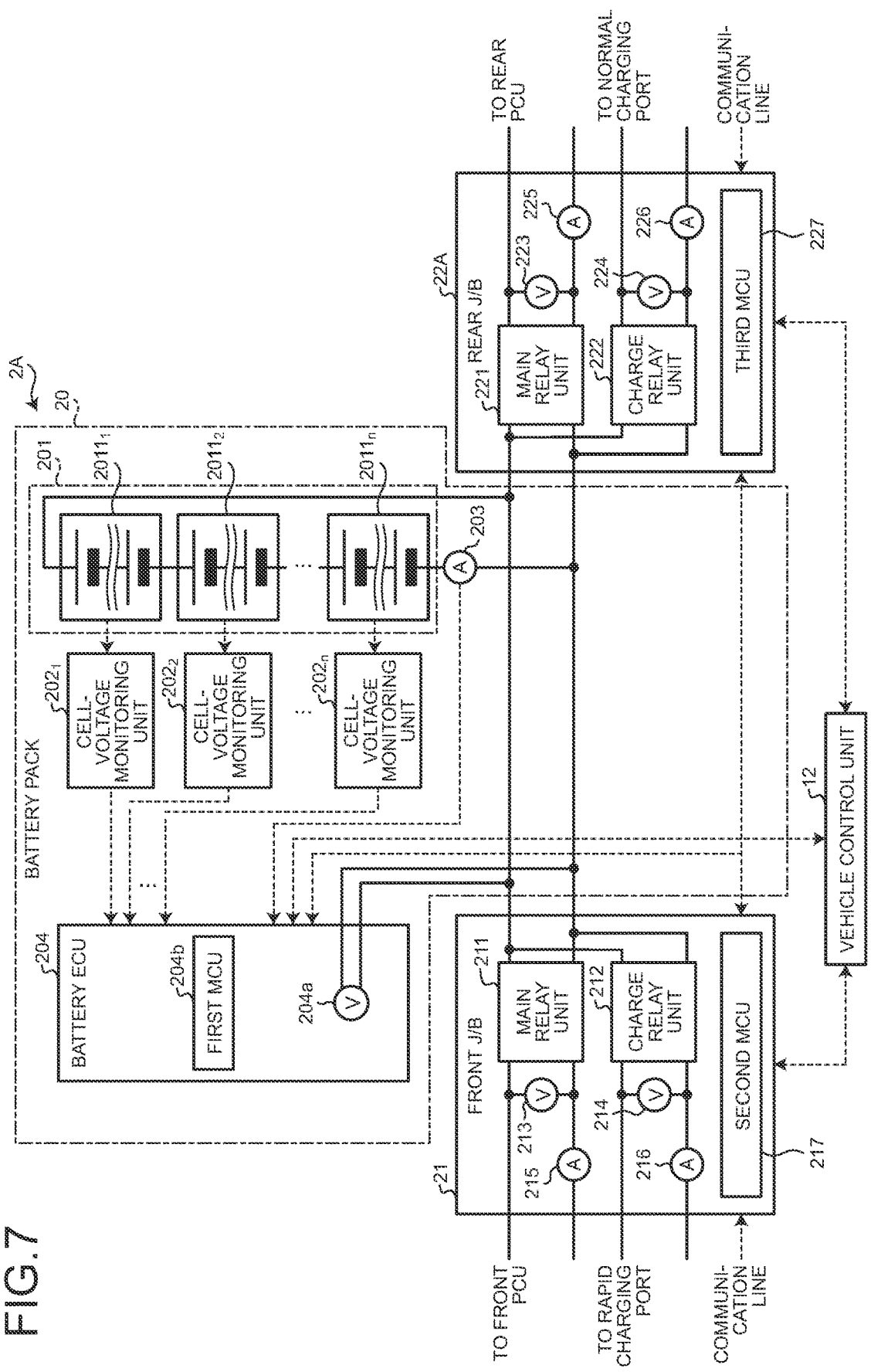
FIG. 7 is a diagram schematically illustrating a detailed configuration example of a battery pack, a front junction box, and a rear junction box in the in-vehicle system according to the second embodiment.

Next, detailed configurations of the battery pack 20, the front J/B 21, and the rear J/B 22A in the in-vehicle system 2A will be described. FIG. 7 is a diagram schematically illustrating a detailed configuration example of the battery pack 20, the front J/B 21, and the rear J/B 22A in the in-vehicle system 2A.

Detailed Configuration of Rear J/B 22

As illustrated in FIG. 7, the rear J/B 22A is provided on the electric power lines electrically connected to the positive electrode and the negative electrode of the assembled battery 201. The rear J/B 22A is provided with a main relay unit 221, a charge relay unit 222, a fourth voltage detection unit 223, a fifth voltage detection unit 224, a fourth current detection unit 225, a fifth current detection unit 226, and a third MCU 227.

The main relay unit 221 switches the electrical connection state between the assembled battery 201 and the rear PCU 5 to a power-distributed state or a shut-off state in accordance with a control signal from the third MCU 227. The main relay unit 221 has a configuration similar to that of the main relay unit 211 of the front J/B 21 (see FIG. 3) and has the first main relay 211a and the second main relay 211b. Therefore, detailed descriptions thereof will be omitted.

The charge relay unit 222 switches the electrical connection state between the assembled battery 201 and the normal charging port 9 to a power-distributed state or a shut-off state in accordance with a control signal from the third MCU 227. The charge relay unit 222 has a configuration similar to that of the charge relay unit 212 of the front J/B 21 (see FIG. 3) and has the first charge relay 212a and the second charge relay 212b. Therefore, detailed descriptions thereof will be omitted.

The fourth voltage detection unit 223 is electrically connected between the pair of electric power lines connecting the battery pack 20 and the rear PCU 5 and is electrically connected in parallel with the assembled battery 201. Furthermore, the fourth voltage detection unit 223 is electrically connected to the third MCU 227. The fourth voltage detection unit 223 detects the voltage value between the positive electrode and the negative electrode of the battery pack 20 and outputs this detection result to the third MCU 227. The fourth voltage detection unit 223 is composed by using, for example, an A/D converter (not illustrated). Specifically, the fourth voltage detection unit 223 converts the input voltage value to a digital signal by an A/D converter and outputs the signal to the third MCU 227.

The fifth voltage detection unit 224 is electrically connected between the pair of electric power lines electrically connecting the battery pack 20 and the charger and is electrically connected in parallel with respect to the assembled battery 201. Furthermore, the fifth voltage detection unit 224 is electrically connected to the third MCU 227. The fifth voltage detection unit 224 detects the voltage value between the positive electrode and the negative electrode of the battery pack 20 and outputs this detection result to the third MCU 227. The fifth voltage detection unit 224 is composed by using, for example, an A/D converter (not illustrated). Specifically, the fifth voltage detection unit 224 converts the input voltage value to a digital signal by an A/D converter and outputs the signal to the third MCU 227.

The fourth current detection unit 225 detects the current value in the battery pack 20. The fourth current detection unit 225 is electrically connected in series with the assembled battery 201 and is electrically connected to the third MCU 227. Specifically, the fourth current detection unit 225 is provided between the electric power lines of the second main relay 211b and the front PCU 3 (negative electrode side of the inverter 31). The fourth current detection unit 225 detects the current value between the positive electrode and the negative electrode of the assembled battery 201 and outputs this detection result to the third MCU 227.

The fifth current detection unit 226 detects the current value in the battery pack 20. The fifth current detection unit 226 is electrically connected in series with the assembled battery 201 and is electrically connected to the third MCU 227. Specifically, the fifth current detection unit 226 is provided between the electric power lines of the second charge relay 212b and the charger (negative electrode side). The fifth current detection unit 226 detects the current value between the positive electrode and the negative electrode of the assembled battery 201 and outputs this detection result to the third MCU 227.

The third MCU 227 includes, for example, a memory, a processor having hardware of a CPU, and a signal input part. The third MCU 227 receives the signals of the detection results detected by each of the fourth voltage detection unit 223, the fifth voltage detection unit 224, the fourth current detection unit 225, and the fifth current detection unit 226. Furthermore, the third MCU 227 monitors malfunctioning of each of the main relay unit 221, the charge relay unit 222, the fourth voltage detection unit 223, the fifth voltage detection unit 224, and the first voltage detection unit 204a in accordance with the control signals from the vehicle control unit 12.

The in-vehicle system 2A composed in this manner monitors malfunctioning of each of the units constituting the in-vehicle system 2A while the vehicle 1A is stopped in accordance with the control signals from the vehicle control unit 12 while the first MCU 204b, the second MCU 217, and the third MCU 227 work in coordination with one another. In other words, the first MCU 204b, the second MCU 217, and the third MCU 227 executes the operations similar to that of FIG. 4 while they work in coordination with one another.

Figure 8:
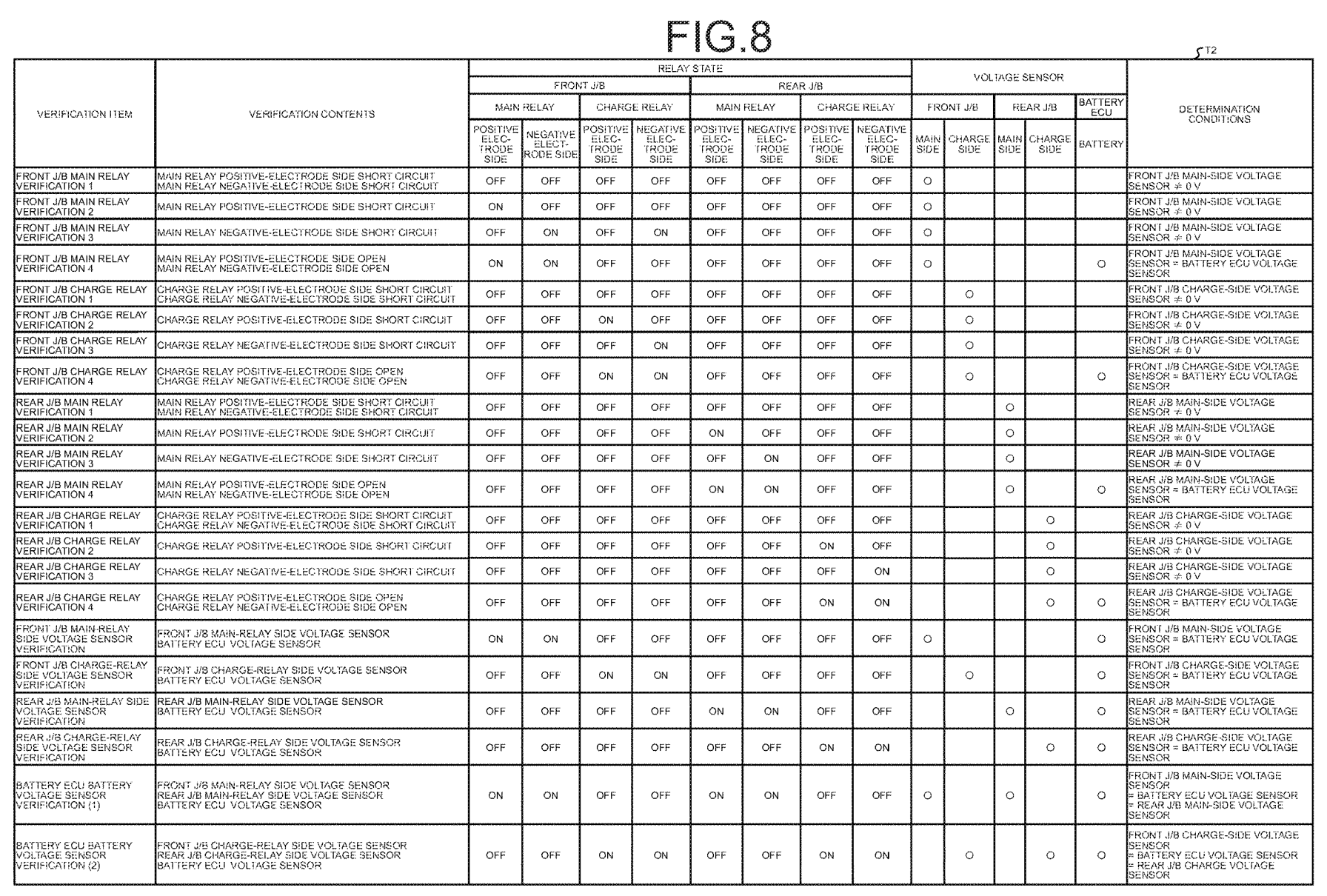

FIG. 8 is a diagram illustrating an example of contents of a malfunction determination process executed by the in-vehicle system 2A according to the second embodiment. As illustrated in Table T2 of FIG. 8, malfunctioning of each of the units constituting the in-vehicle system 2A is monitored while the vehicle 1A is stopped in accordance with the control signals from the vehicle control unit 12 while the first MCU 204b, the second MCU 217, and the third MCU 227 work in coordination with one another. Note that, in the second embodiment, while the vehicle 1A is stopped, malfunctioning of each of the units constituting the in-vehicle system 2A may be monitored while any of the first MCU 204b, the second MCU 217, and the third MCU 227 serves as a master and the rest thereof serves as slaves to work in coordination.

Furthermore, the in-vehicle system 2A can calculate the current value of the battery pack 20 even if any one of the first current detection unit 203, the second current detection unit 215, the third current detection unit 216, the fourth current detection unit 225, and the fifth current detection unit 226 malfunctions by using the first current detection unit 203 in the battery pack 20, the second current detection unit 215 and the third current detection unit 216 in the front J/B 21, and the fourth current detection unit 225 and the fifth current detection unit 226 of the rear J/B 22A. Specifically, if the second current detection unit 215 of the front J/B 21 malfunctions, the in-vehicle system 2A can calculate the current value of the current of the front J/B 21 by subtracting the current value detected by the fourth current detection unit 225 of the rear J/B 22A from the current value detected by the first current detection unit 203.

By virtue of this configuration described above, the front J/B 21 is disposed in the front side of the battery pack 20, the rear J/B 22A is disposed in the rear side; therefore, the in-vehicle system 2A can distinguish and detect malfunctioning of the first voltage detection unit 204a (voltage sensor) of the battery ECU 204, the main relay unit 211 in the front J/B 21, and the main relay unit 221 in the rear J/B 22A. By virtue of this, the in-vehicle system 2A can carry out sensing having redundancy by utilizing the sensors constituting the in-vehicle system 2A and the relays as one system. As a result, since the in-vehicle system 2A has redundancy, the vehicle 1A can continuously travel even if any of the first voltage detection unit 204a (voltage sensor) of the battery ECU 204, the main relay unit 211 in the front J/B 21, and the main relay unit 221 in the rear J/B 22A malfunctions.

Since the second MCU 217 uses the detection results of the first current detection unit 203, the second current detection unit 215, the third current detection unit 216, the fourth current detection unit 225, and the fifth current detection unit 226, the above described in-vehicle system 2A can calculate the current value of the battery pack 20 even when any one of the first current detection unit 203, the second current detection unit 215, the third current detection unit 216, the fourth current detection unit 225, and the fifth current detection unit 226 malfunctions.

OTHER EMBODIMENTS

In the first and second embodiments, the above described "units" can be replaced, for example, by "circuits". For example, the vehicle control unit can be replaced by a vehicle control circuit.

In the explanation of the flowchart in the present specification, the context of the process between the steps are indicated by using the expressions of "first", "then", "subsequently" or the like. However, the sequences of the required process to enable the embodiment are not uniquely specified by the expressions. In other words, the sequences of the process in the flowchart described in the present specification can be altered within a range without any contradiction.

The in-vehicle system according to the present embodiments is capable of distinguishing and detecting malfunctions in the voltage sensor and the relay in the junction box.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An in-vehicle system comprising:
   a junction box disposed at least one of front and rear of a battery pack provided in an electric vehicle; and
   a first voltage detection unit that detects a voltage value of the battery pack, wherein
   the junction box has
   a first relay unit that is electrically connected to the battery pack and a drive source, and switches a state of the battery pack and the drive source to a power-distributed state or a shut-off state by an on/off operation,
   a second voltage detection unit that is electrically connected in parallel with the battery pack, and detects a voltage value of the battery pack, and
   a controller configured to control the on/off operation of the first relay unit, and
   the controller monitors whether each of the first relay unit, the first voltage detection unit, and the second voltage detection unit has an abnormality or not based on a detection result detected by each of the first voltage detection unit and the second voltage detection unit when the first relay unit carries out the on/off operation.

2. The in-vehicle system according to claim 1, wherein
   the junction box further has
   a second relay unit that is electrically connected to the battery pack and a charging port, which is supplied with electric power from outside, and switches a state of the battery pack and the charging port to a power-distributed state or a shut-off state by an on/off operation, and
   a third voltage detection unit that is electrically connected in parallel with the battery pack, and detects the voltage value of the battery pack, and
   the controller monitors whether each of the second relay unit, the first voltage detection unit, and the third voltage detection unit is malfunctioning or not based on a detection result detected by each of the first voltage detection unit and the third voltage detection unit when the second relay unit carries out the on/off operation.

3. The in-vehicle system according to claim 2, wherein the controller subjects the first relay unit and the second relay unit to the on/off operations while the electric vehicle is stopped, monitors whether any of the first relay unit, the first voltage detection unit, and the second voltage detection unit is malfunctioning or not based on the detection result detected by each of the first voltage detection unit and the second voltage detection unit when the first relay unit is subjected to the on/off operation, and monitors whether any of the second relay unit, the first voltage detection unit, and the third voltage detection unit is malfunctioning or not based on the detection result detected by each of the first voltage detection unit and the third voltage detection unit when the second relay unit is subjected to the on/off operation.

4. The in-vehicle system according to claim 3, wherein, when at least one of the first relay unit, the second relay unit, the first voltage detection unit, the second voltage detection unit, and the third voltage detection unit is malfunctioning, the controller outputs a warning indicating occurrence of the malfunction to a display monitor provided in the electric vehicle.

5. The in-vehicle system according to claim 4, wherein the junction box is disposed in front and rear of the battery pack.

6. The in-vehicle system according to claim 5, further comprising:

a first current detection unit that detects a current value of the battery pack; wherein the junction box further has a second current detection unit that is electrically connected between the drive source and the first relay unit, and detects the current value of the battery pack, and the controller monitors the current value of the battery pack based on the current value detected by each of the first current detection unit and the second current detection unit.

7. The in-vehicle system according to claim 3, wherein the junction box is disposed in front and rear of the battery pack.

8. The in-vehicle system according to claim 7, further comprising:

a first current detection unit that detects a current value of the battery pack; wherein the junction box further has a second current detection unit that is electrically connected between the drive source and the first relay unit, and detects the current value of the battery pack, and the controller monitors the current value of the battery pack based on the current value detected by each of the first current detection unit and the second current detection unit.

9. The in-vehicle system according to claim 2, wherein the junction box is disposed in front or rear of the battery pack.

10. The in-vehicle system according to claim 9, further comprising:

a first current detection unit that detects a current value of the battery pack; wherein the junction box further has a second current detection unit that is electrically connected between the drive source and the first relay unit, and detects the current value of the battery pack, and the controller monitors the current value of the battery pack based on the current value detected by each of the first current detection unit and the second current detection unit.

11. The in-vehicle system according to claim 1, wherein the junction box is disposed in front and rear of the battery pack.

12. The in-vehicle system according to claim 11, further comprising:

a first current detection unit that detects a current value of the battery pack; wherein the junction box further has a second current detection unit that is electrically connected between the drive source and the first relay unit, and detects the current value of the battery pack, and the controller monitors the current value of the battery pack based on the current value detected by each of the first current detection unit and the second current detection unit.

13. A junction box disposed at least one of front and rear of a battery pack provided in an electric vehicle and having a first voltage detection unit capable of detecting a voltage value, the junction box comprising:

a first relay unit that is electrically connected to the battery pack and a drive source, and switches a state of the battery pack and the drive source to a power-distributed state or a shut-off state by an on/off operation;

a second voltage detection unit that is electrically connected in parallel with the battery pack, and detects a voltage value of the battery pack; and a controller configured to control the on/off operation of the first relay unit, wherein the controller monitors whether each of the first relay unit, the first voltage detection unit, and the second voltage detection unit has an abnormality or not based on a detection result detected by each of the first voltage detection unit and the second voltage detection unit when the first relay unit carries out the on/off operation.

* * * * *